United States Patent
Ichihashi et al.

(10) Patent No.: US 8,669,535 B2
(45) Date of Patent: Mar. 11, 2014

(54) ELECTRON GUN

(75) Inventors: Mikio Ichihashi, Kodaira (JP); Takashi Onishi, Mito (JP); Shunichi Watanabe, Hitachinaka (JP); Keiji Tamura, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/322,025

(22) PCT Filed: Apr. 14, 2010

(86) PCT No.: PCT/JP2010/002684
§ 371 (c)(1),
(2), (4) Date: Nov. 22, 2011

(87) PCT Pub. No.: WO2010/134259
PCT Pub. Date: Nov. 25, 2010

(65) Prior Publication Data
US 2012/0062094 A1   Mar. 15, 2012

(30) Foreign Application Priority Data

May 22, 2009   (JP) ................................ 2009-123684

(51) Int. Cl.
*H01J 1/50* (2006.01)
(52) U.S. Cl.
USPC ............... 250/396 ML; 250/396 R; 250/310; 313/441; 313/442; 313/452; 313/153; 313/310
(58) Field of Classification Search
USPC ......... 313/414, 441–460, 495–497, 293–304, 313/306, 309–310, 346, 351, 355, 11; 438/20; 250/396 R, 397, 396 ML, 396, 250/310
See application file for complete search history.

(56) References Cited

U.S. PATENT DOCUMENTS

| | | | | |
|---|---|---|---|---|
| 4,295,072 A | * | 10/1981 | Todokoro et al. | 313/7 |
| 5,041,732 A | | 8/1991 | Saito et al. | |
| 5,155,412 A | | 10/1992 | Chang et al. | |
| 5,371,371 A | * | 12/1994 | Yamazaki et al. | 250/396 R |
| 5,760,548 A | * | 6/1998 | Beeteson et al. | 315/366 |

(Continued)

FOREIGN PATENT DOCUMENTS

| | | |
|---|---|---|
| JP | 64-076654 | 3/1989 |
| JP | 2-297852 | 12/1990 |

(Continued)

OTHER PUBLICATIONS

German Office Action issued in German Patent Application No. 11 2010 002 063.9 dated Feb. 8, 2013.

*Primary Examiner* — Donald Raleigh
(74) *Attorney, Agent, or Firm* — McDermott Will & Emery LLP (57) ABSTRACT

The present invention has an object to provide a cold cathode field-emission electron gun with low aberration, to thereby provide a high-brightness electron gun even in the case of a large current. The present invention provides a field-emission electron gun which extracts an electron beam from a cathode and converges the extracted electron beam, the field-emission electron gun including: a magnetic field lens which is provided such that the cathode is disposed inside of a magnetic field of the lens; and an extraction electrode for extracting electrons from the cathode, the extraction electrode being formed into a cylindrical shape without an aperture structure. The present invention can provide an electron gun having a function of converging an electron beam using a magnetic field, the electron gun which is capable of reducing an incidental electrostatic lens action and has small aberration and high brightness.

16 Claims, 8 Drawing Sheets

(56) References Cited

U.S. PATENT DOCUMENTS

| | | |
|---|---|---|
| 6,392,333 B1 | 5/2002 | Veneklasen et al. |
| 2002/0096641 A1* | 7/2002 | Yonezawa .................... 250/398 |
| 2004/0183013 A1* | 9/2004 | Nakasuji et al. ............. 250/310 |
| 2007/0085018 A1 | 4/2007 | Zhou et al. |

FOREIGN PATENT DOCUMENTS

| | | |
|---|---|---|
| JP | 6-162979 | 6/1994 |
| JP | 2000-003689 | 1/2000 |
| JP | 2000-090866 | 3/2000 |
| JP | 2000-285839 | 10/2000 |
| JP | 2006-210254 | 8/2006 |
| JP | 2006-324119 | 11/2006 |
| JP | 2008-140623 | 6/2008 |
| JP | 2008140623 A * | 6/2008 |
| JP | 2008-311174 | 12/2008 |
| JP | 2009-087593 | 4/2009 |
| WO | WO 2005/124815 A1 | 12/2005 |

* cited by examiner

ELECTRON GUN

RELATED APPLICATIONS

This application is the U.S. National Phase under 35 U.S.C. §371 of International Application No. PCT/JP2010/002684, filed on Apr. 14, 2010, which in turn claims the benefit of Japanese Application No. 2009-123684, filed on May 22, 2009, the disclosures of which Applications are incorporated by reference herein.

TECHNICAL FIELD

The present invention relates to an electron gun, and more particularly, to a cold cathode field-emission (Cold-FE) electron gun which generates a high-brightness electron beam.

BACKGROUND ART

An electron microscope irradiates a material to be observed (sample) with an electron beam emitted from an electron gun while controlling the electron beam using an electron optical system such as an electron lens and a deflector. Then, the principle of the electron microscope is to detect transmission electrons transmitted through the irradiated sample and reflection electrons and secondary electrons generated by the interaction between the sample and the electron beam and thus observe the sample in an enlarged manner. The electron gun which generates the electron beam plays an important role in this electron microscope.

In a typical structure of the electron microscope, the electron gun which generates the electron beam is provided so as to be combined with an irradiation system, an electromagnetic lens such as an objective lens, and a detection device for the electron beam. Here, the electromagnetic lens has a function of transporting and converging the electron beam to irradiate the sample therewith.

In order to obtain a clear observation image with high resolution for a short time, it is necessary to irradiate the sample with a bright electron beam (large irradiation current) being converged on a small spot on the sample. At this time, in order to form a small and bright electron beam spot on the sample, it is necessary to increase the brightness of the electron gun. Here, the brightness of the electron beam is defined as the amount of current per area per solid angle of a light source, and in the principle of electron optics, the brightness of the electron beam which is transported by the electromagnetic lens without changing its energy cannot exceed its original brightness. For this reason, a high-brightness electron gun is necessary to obtain an electron microscope with higher brightness.

A cold cathode field-emission (C-FE) electron gun is widely used as such a high-brightness electron gun for an electron microscope having high resolution. According to the principle of electron beam generation of this electron gun, a strong electric field is generated in a leading end part of a tungsten single crystal which is thinly sharpened by electric field polishing, and an electron beam is extracted by the strong electric field. The cold cathode field-emission electron gun is closer to a point light source than other types of electron sources, and thus can provide a high-brightness electron beam. In addition, the cold cathode field-emission electron gun can provide an electron beam in which energy fluctuations (energy width ΔE) of each electron in the extracted electron beam are small.

Up to now, widely used is an electron gun having the structure obtained by combining this cold cathode field-emission electron gun and an electrostatic lens structure which is put into practical use by Butler and others in 1966.

Figure 1:
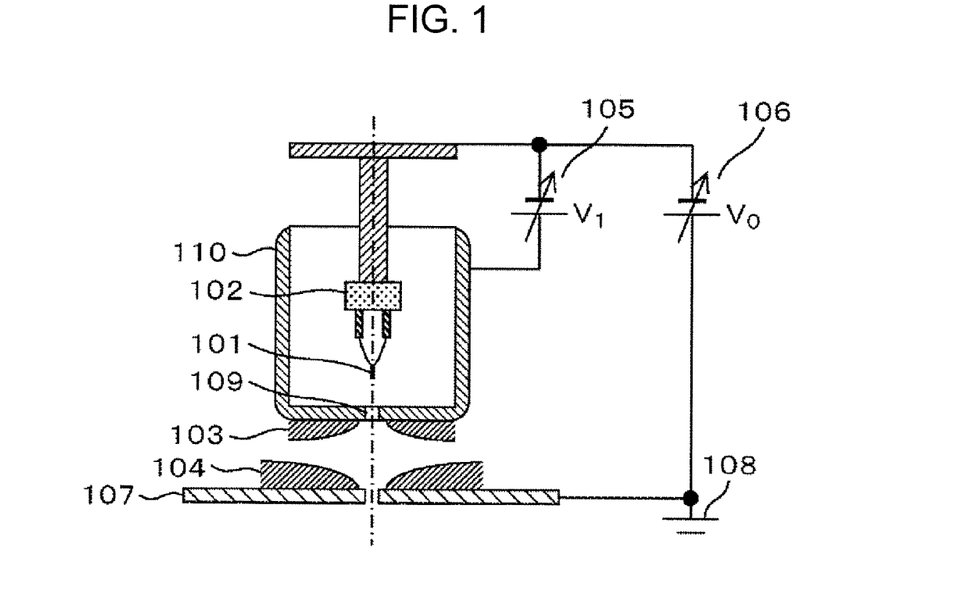
FIG. 1 illustrates a structure of a cold cathode field-emission electron gun including a Butler-type electrostatic lens.

FIG. 1 illustrates the structure of a typical cold cathode field-emission electron gun including a Butler-type electrostatic lens. A potential difference ($V_1$) between an electron source 101 and an extraction electrode 110 is applied by an extraction power supply 105, and this forms an electric field in a leading end part of the electron source 101 (a lowermost part of the electron source 101 in the figure). Field emission is caused at the electron source 101 by the formed electric field, and an electron beam is emitted. Part of the emitted electron beam passes through an aperture 109 provided in an extraction electrode 110, and is converged by the electrostatic lens action of an electric field formed by Butler-type electrodes 103 and 104 provided between the extraction electrode 110 and an anode 107. At the same time, the part of the emitted electron beam is accelerated by a potential difference ($V_0 - V_1$) between the extraction electrode and the anode (when the magnitude of the acceleration potential $|V_0| >$ the magnitude of the extraction potential $|V_1|$) or is decelerated (when $|V_0| < |V_1|$), to be emitted to a sample.

This structure can easily make the structure of the electron gun relatively small, and thus is advantageous to achieve an ultrahigh vacuum. In addition, this structure is advantageous because the electrostatic lens enables both the acceleration and convergence of the electron beam at the same time.

Unfortunately, in this electron gun, the total amount of current which can be taken out is smaller than that of other types of electron sources such as a Schottky electron source, and if a large current is to be taken out, it is necessary to use an electron beam which is emitted at a wide angle from a chip. For example, this electron gun is disadvantageous in that, if several percent of the total amount of current emitted from the chip (cathode) is to be taken out, the brightness (effective brightness) considerably decreases due to an influence of the aberration of the electrostatic lens. As a larger amount of current is to be taken out, this phenomenon occurs more remarkably. Such aberration of the electrostatic lens is difficult to reduce. For this reason, in an analytical electron microscope which requires a high irradiation current for the purpose of elemental analysis or other analyses, the brightness and the energy width are relegated to second place, and another electron source such as a Schottky electron source (hot cathode field-emission electron gun) is used in many cases.

Meanwhile, for the conventional hot cathode field-emission electron gun, an electron gun which converges an electron beam using a magnetic field lens has been devised for the purpose of enhancing the brightness of the electron gun.

In terms of a reduction in aberration, a larger number of structures (referred to as an immersion type) in which an electron source is provided inside of a magnetic field have been devised than such a structure as disclosed in Patent Literature 1 in which a converging lens formed by a magnetic field is provided immediately below an electron gun, and there are known examples of the detailed structure of the immersion type as disclosed in Patent Literatures 2 to 7.

The structures disclosed in these known examples generally concern a hot cathode field-emission electron gun, and thus have a great difference from the structure of a cold cathode field-emission electron gun in whether or not a suppressor is provided. The suppressor which is characteristically provided in the hot cathode field-emission electron gun has a function of reflecting thermal electrons emitted from a heated filament adjacent to an electron source and confining the thermal electrons to the suppressor with a negative potential being applied to the electron source.

In contrast, a filament is not heated in the cold cathode field-emission electron gun, and thermal electrons are not emitted, so that the suppressor is unnecessary. In the cold cathode field-emission electron gun, an electrode provided adjacently to an electron source is only an extraction electrode, and the extraction electrode serves to generate a large electric field in a leading end part of the electron source, to thereby cause field emission from the leading end.

Because there is such a difference in structure, an optimal structure is considerably different between the hot cathode field-emission electron gun and the cold cathode field-emission electron gun, even in an immersion-type electron gun including a magnetic field lens. For reasons to be described later, even if the structures of the known examples are applied to the cold cathode field-emission electron gun without any change, high performance cannot be achieved.

CITATION LIST

Patent Literature

Patent Literature 1: JP 64-76654 A
Patent Literature 2: JP 2-297852 A
Patent Literature 3: JP 2000-3689 A
Patent Literature 4: JP 2000-90866 A
Patent Literature 5: JP 2000-285839 A
Patent Literature 6: JP 6-162979 A
Patent Literature 7: JP 2006-210254 A

SUMMARY OF INVENTION

Technical Problem

The present invention has an object to provide a cold cathode field-emission electron gun with low aberration, to thereby provide a high-brightness electron gun even in the case of a large current.

Solution to Problem

The present invention provides a field-emission electron gun which extracts an electron beam from a cathode and converges the extracted electron beam, the field-emission electron gun including: a magnetic field lens which is provided such that the cathode is disposed inside of a magnetic field of the lens; and an extraction electrode for extracting electrons from the cathode, the extraction electrode being formed into a cylindrical shape without an aperture structure.

In a different way of expression, the present invention provides a field-emission electron gun including a magnetic field lens which is provided such that the cathode is disposed inside of a magnetic field of the lens, in which a converging action of the magnetic field of the magnetic field lens is larger than a converging action of an electric field which is formed between an extraction electrode for extracting electrons from the cathode and an anode for accelerating the electron beam.

Advantageous Effects of Invention

The present invention can provide an electron gun having a function of converging an electron beam using a magnetic field, the electron gun which is capable of reducing an incidental electrostatic lens action and has small aberration and high brightness.

DESCRIPTION OF EMBODIMENTS

Hereinafter, the present invention is described in detail by way of embodiments.

Embodiment 1

Figure 2:
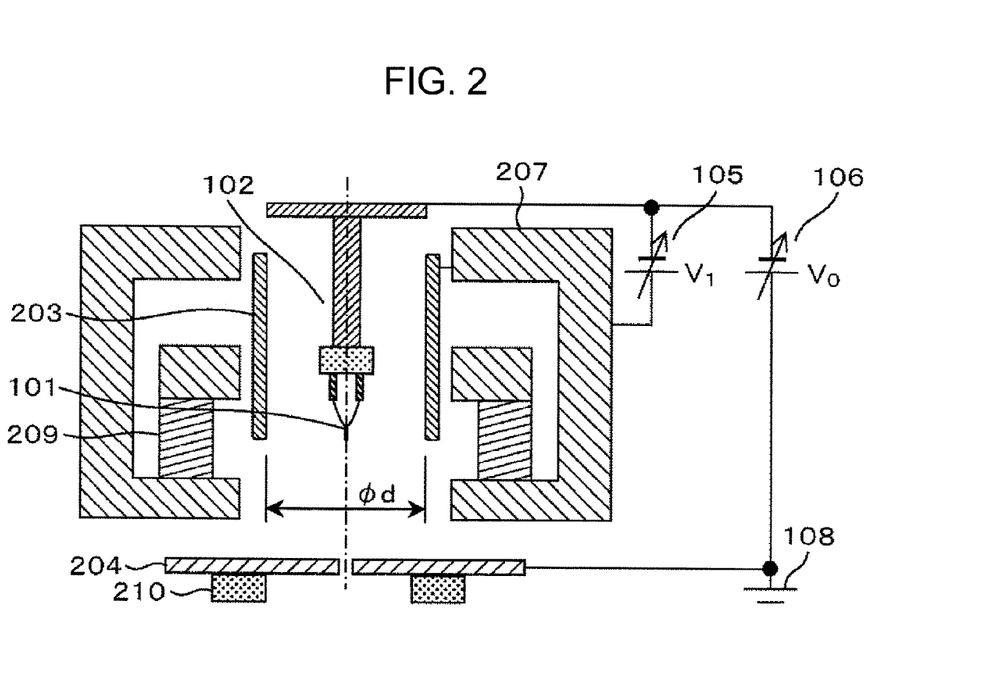
FIG. 2 illustrates a structure of an immersion-type cold cathode field-emission electron gun according to an embodiment of the present invention.

FIG. 2 illustrates a mode of an immersion-type cold cathode field-emission electron gun as an exemplary embodiment of the present invention.

FIG. 2 illustrates the structure of the electron gun according to the present invention. An electron source 101, an electron source holding part 102, an extraction electrode 203, an anode 204, a magnetic path 207, and a permanent magnet 209 are disposed in a vacuum container (not illustrated), and the inside of the vacuum container is maintained at an ultrahigh vacuum of approximately $10^{-8}$ Pa. A potential $V_0$ (negative potential) is applied to the electron source 101 by an acceleration power supply 106 with reference to a ground part 108. Further, a voltage $V_1$ (positive voltage, several kilovolts) is applied to the extraction electrode 203 by an extraction power supply 105 with reference to this electron source potential. Field emission is caused by the potential ($V_1$), and an electron beam (having an energy of $V_0$–$V_1$) is emitted from the electron source 101. This electron beam is converged by a magnetic field lens (in the present embodiment, a magnetic field generated on an electron beam path by the permanent magnet 209 and the magnetic path 207), and is accelerated toward the anode 204. Here, the magnetic field lens is generated by not an electromagnet but the permanent magnet 209, and the permanent magnet 209 is selected as a result of considering the difficulty in introducing the electromagnet into an ultra-high-vacuum and high-voltage portion of the electron gun. The magnetic field generated by the permanent magnet 209 and the magnetic path 207 which is formed of a high magnetic permeability material such as permalloy is static, and hence the strength thereof cannot be adjusted. In this regard, the effective strength of the magnetic field lens can be changed by moving the position of the electron source 201 up and down with respect to the magnetic field, and this enables the adjustment of electron optical conditions such as a virtual light source position. Accordingly, a position adjusting mechanism (not illustrated) exists in the electron source holding part 102.

Here, the extraction electrode 203 has a cylindrical shape which is opened on the anode side and does not have an aperture structure. Because a function of the extraction electrode is to generate a high electric field at an electron source leading end, the extraction electrode appears to need to be positioned between the electron source and the anode. As exemplified in FIG. 1 illustrating the typical structure of the conventional cold cathode field-emission electron gun, a cup-shaped structure having an aperture structure on the anode side of the electron source is used for the extraction electrode in many cases such as that denoted by 110.

In contrast to this, in the present embodiment, the extraction electrode 203 does not have an aperture structure.

The electron source 101 has a sharply-peaked leading end having a diameter of several micrometers, whereas the extraction electrode has a macroscopic structure of ten millimeters to several tens of millimeters. Assuming that the radius of curvature of a hemispherical shape of a leading end of the cathode is r (up to 1 μm), the distance between the anode and the cathode is R (up to 10 mm), and the potential difference between the anode and the cathode is V, an electric field strength F applied to the leading end of the cathode is expressed by the following expression.

$$F=2V/\{r \log_e(4R/r)\}$$

As is apparent from the relation between R and r, the electric field strength F depends only on V and r almost irrespective of R. This asymmetry reveals that the electric field strength of the leading end part of the electron source is determined substantially by the structure of the electron source such as the diameter of the electron source leading end, and barely depends on the position and structure of the extraction electrode. Accordingly, even if the extraction electrode has the cylindrical shape, field emission occurs, and the present invention employs this phenomenon.

Figure 8:
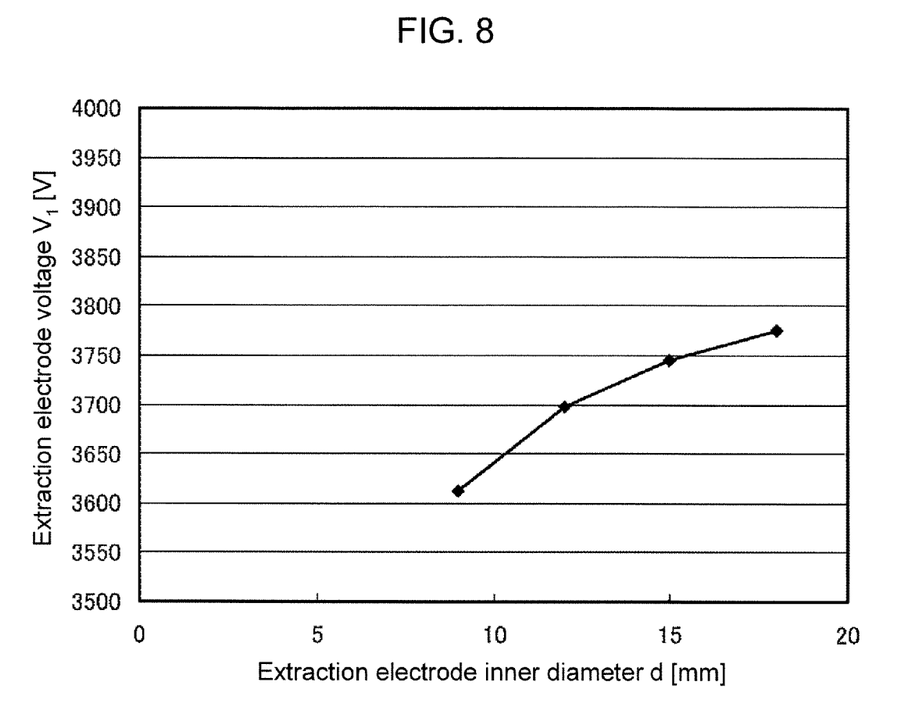
FIG. 8 shows a relation between an applied voltage and the electric field strength of a chip leading end in a cylindrical extraction electrode.

FIG. 8 shows a relation (theoretical analysis result) between an applied voltage and the electric field strength of a chip leading end in a given cylindrical extraction electrode. The horizontal axis represents an inner diameter d of the given extraction electrode, and the vertical axis represents an extraction voltage ($V_1$) necessary to generate an electric field of $4\times10^{19}$ V/m (calculated value) at the chip leading end.

Advantages obtained by forming the extraction electrode into the cylindrical shape without an aperture structure are that discontinuous points in potential gradient occurring in the aperture portion are resolved and that an electrostatic lens effect existing between the extraction electrode 203 and the anode 204 is reduced. The present invention is advantageous in that an electron beam is converged by not an electrostatic lens structure with large aberration but the magnetic field lens, to thereby reduce the aberration of the entire electron gun. On this occasion, it is desirable to reduce a converging effect of the electric field as far as possible. The extraction electrode is opened on the anode side, and an aperture structure is not provided on the electron beam path, whereby the converging force of the electric field can be weakened. As a result, the aberration can be reduced.

Figure 9:
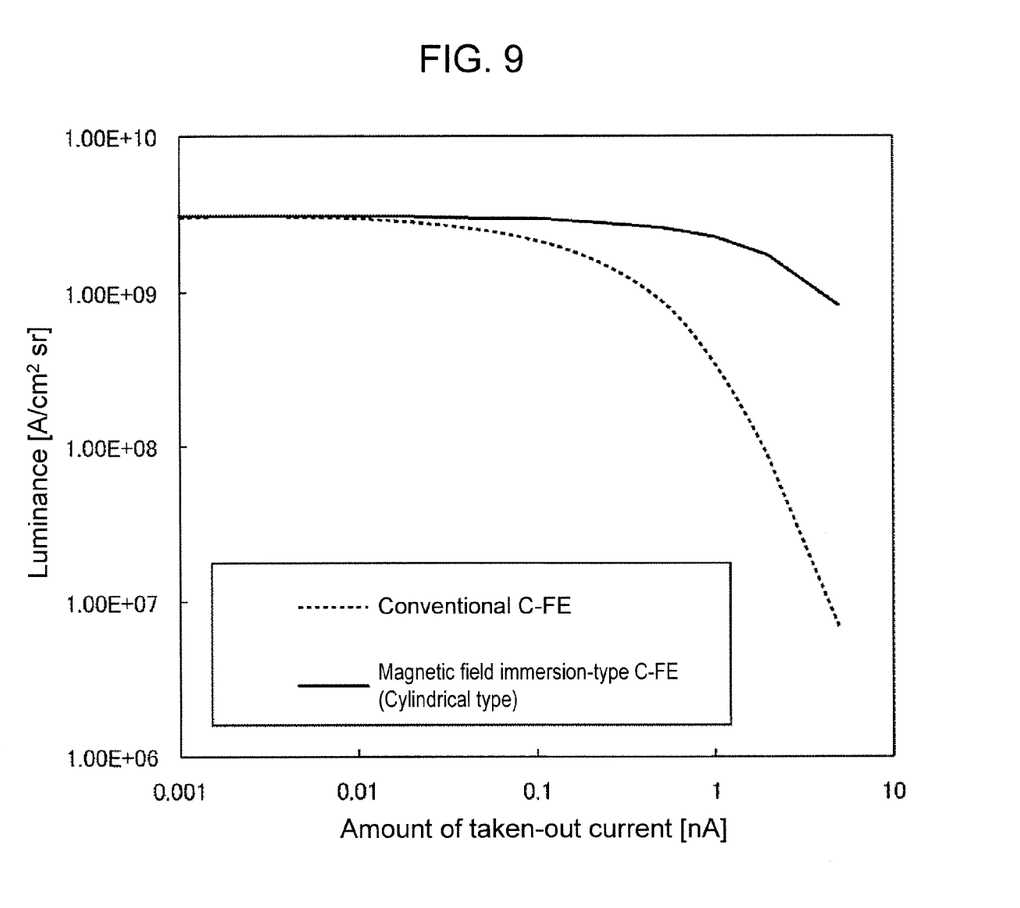
FIG. 9 shows theoretical analysis results of the brightness of a magnetic field immersion-type cold cathode field-emission electron gun and the brightness of the cold cathode field-emission electron gun including the Butler-type electrostatic lens.

FIG. 9 shows the comparison between a theoretical analysis result of the brightness of a magnetic field immersion-type cold cathode field-emission electron gun having a given assumed shape and that of the conventional cold cathode field-emission electron gun (which is not of the magnetic field immersion type). The horizontal axis of the graph represents a probe current, and the vertical axis thereof represents the brightness obtained by analysis. In the case where only a current emitted at a small angle near the center, of the current emitted from the chip, is utilized, the brightness of the electron gun coincides with the on-axis brightness, and hence the brightness is the same between the immersion-type electron gun and the conventional electron gun (the right end of the graph). As the amount of taken-out current is gradually increased by collecting a current emitted at a large angle, however, the brightness starts to decrease due to an influence of the aberration of the electron gun. In this case, the graph reveals that, in the magnetic field immersion-type cold cathode field-emission electron gun with smaller aberration, the current can be taken out up to a larger amount with the brightness being maintained. This comparison reveals that, in the immersion-type cold cathode field-emission electron gun, a larger amount of current can be obtained with the same brightness being maintained, that is, approximately ten times larger at the amount of taken-out current at which the brightness starts to drop.

Embodiment 2

A modified example of Embodiment 1 is described. Even if the shape of the extraction electrode is not completely cylindrical and the extraction electrode has a slight aperture structure, it is possible to achieve the object to converge an electron beam mainly by the magnetic field lens while suppressing the converging force and aberration of the electric field lens to be low.

Figure 3:
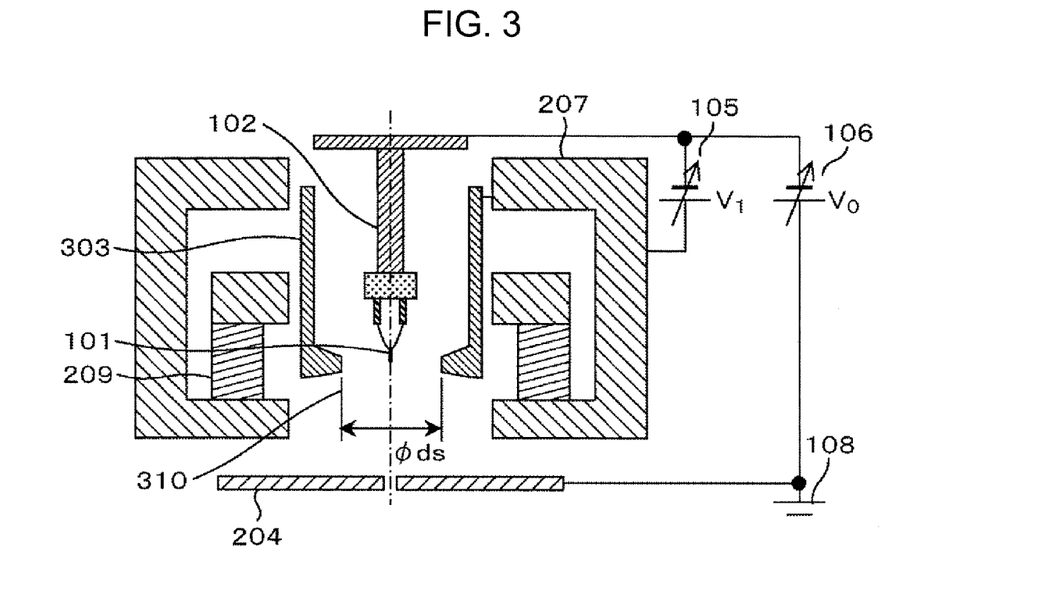
FIG. 3 illustrates a structure of an immersion-type cold cathode field-emission electron gun according to an embodiment of the present invention.

FIG. 3 illustrates the case where the extraction electrode does not have a cylindrical shape. In FIG. 3, a protruding part is provided to such an extent that an extraction electrode 303 does not produce the lens action of the electric field. It is desirable that an inner diameter 310 of the smallest part of the extraction electrode aperture at this time be equal to or larger than 2 mm.

Figure 10:
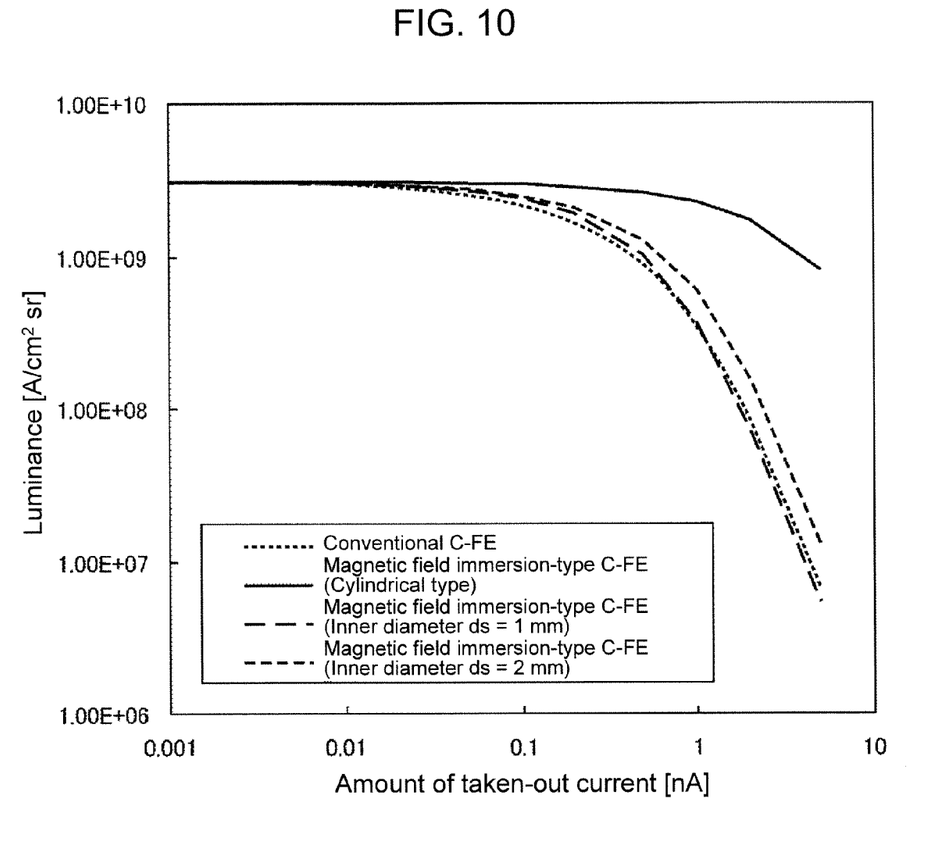
FIG. 10 shows the comparison between the brightness of the magnetic field immersion-type cold cathode field-emission electron gun and the brightnesses thereof when an inner diameter of the smallest part of an extraction electrode aperture is set to 1 mm and 2 mm.

FIG. 10 shows example theoretical analysis results obtained by assuming shapes, in which theoretical analysis results when an inner diameter ds of the smallest part is set to 1 mm and 2 mm are overlaid on the graph of FIG. 9. If the inner diameter of the smallest part is set to 1 mm, the brightness decreases to substantially the same state as that of the conventional cold cathode field-emission electron gun. If the inner diameter of the smallest part is set to 2 mm, the decrease of the brightness is smaller and is closer to the state of the immersion-type electron gun (cylindrical electrode). The graph reveals that the inner diameter of the smallest part needs to be equal to or larger than 2 mm in order to take advantage of the immersion-type electron gun.

Embodiment 3

Further, regardless of whether the anode-side end of the extraction electrode is positioned on the anode side or on the cathode side with respect to the electron source, it is possible to achieve the object to converge an electron beam mainly by the magnetic field lens while suppressing the converging force and aberration of the electric field lens to be low.

Figure 4:
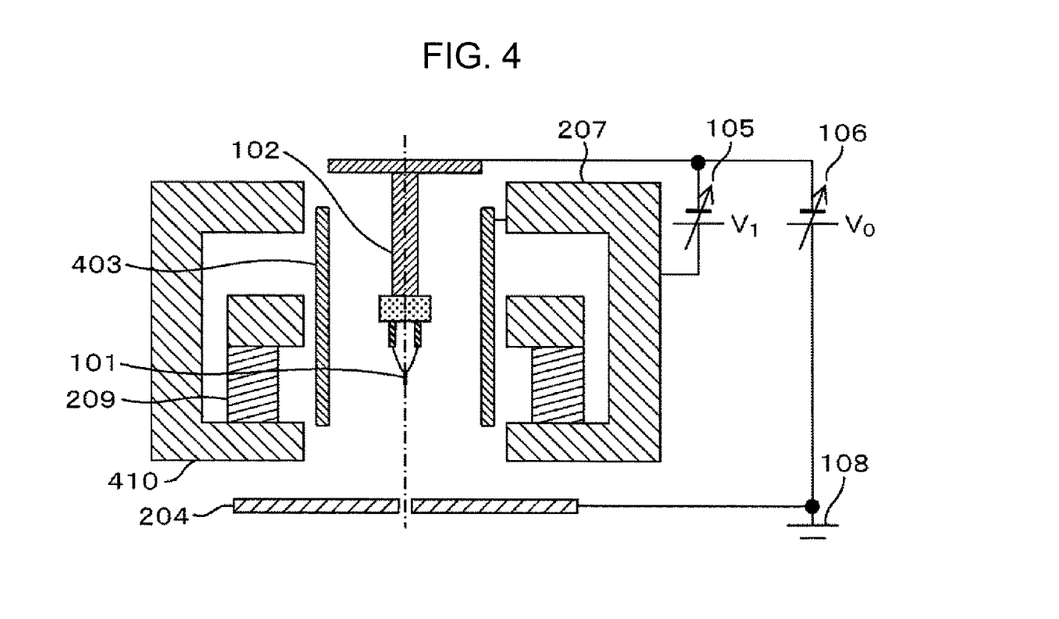
FIG. 4 illustrates a structure of an immersion-type cold cathode field-emission electron gun according to an embodiment of the present invention.
Figure 5:
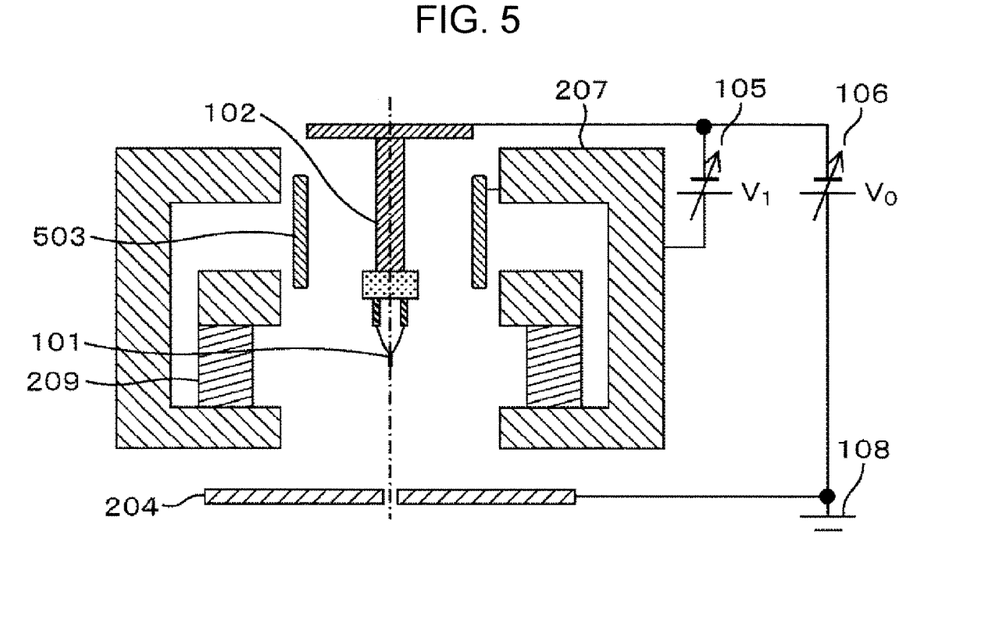
FIG. 5 illustrates a structure of an immersion-type cold cathode field-emission electron gun according to an embodiment of the present invention.

FIG. 4 and FIG. 5 each illustrate another embodiment relating to the position of the anode-side end of the extraction electrode.

In FIG. 4, an extraction electrode 403 is extended toward the anode 404 so as to be longer than the extraction electrode 203 in FIG. 2. The extraction electrode 403 may be extended toward the anode 204 beyond a magnetic path lower surface 410 so as to hide the entire permanent magnet 209 and magnetic path 207 from the electron beam path. Even in this case, the electric field lens effect is not considerably large. As illustrated in FIG. 5, the anode 204 side-end of an extraction electrode 503 may be located at a position higher than the electron source 101 (on the side opposite to the anode).

Figure 7:
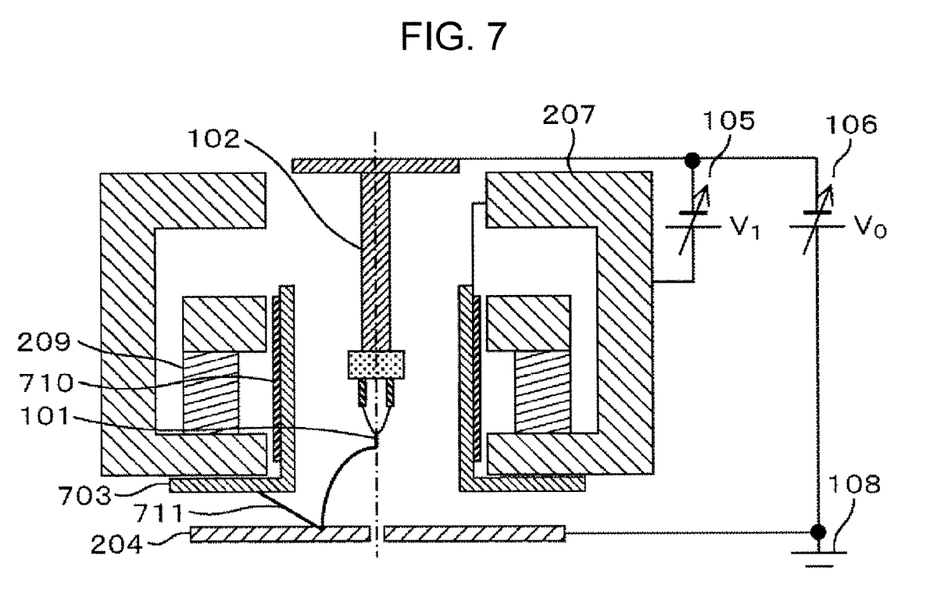
FIG. 7 illustrates a structure of an immersion-type cold cathode field-emission electron gun according to an embodiment of the present invention.

A modified example of FIG. 4 is described with reference to FIG. 7. In FIG. 7, an extraction electrode 703 in FIG. 4 is further extended toward the anode 204, and a sheet-like portion is additionally formed so as to cover the magnetic path 207. In FIG. 7, the extraction electrode 703 covers the magnetic path 207 so as to be opposed to the anode 204, and the reflection of a scattered electron 711 which collides against the anode 204 to be scattered is less likely to reach the magnetic path 707. This structure can prevent gas emission from the magnetic path 707 due to the scattered electron 711. The extraction electrode 703 has been subjected to surface treatment such as gold plating in order to reduce gas emission even if the scattered electron 711 collides thereagainst, and the extraction electrode 703 is sufficiently heated for degassing by a heater 710 before the use of the electron gun. At this time, it is desirable that the heater 710 and the extraction electrode 703 be thermally isolated from the magnetic path 207 by providing cap between the two and the magnetic path 207 or interposing a thermal insulator therebetween. This is because such thermal isolation can reduce the possibility that the permanent magnet 709 is thermally demagnetized by heating of the heater 710.

Embodiment 4

Figure 6:
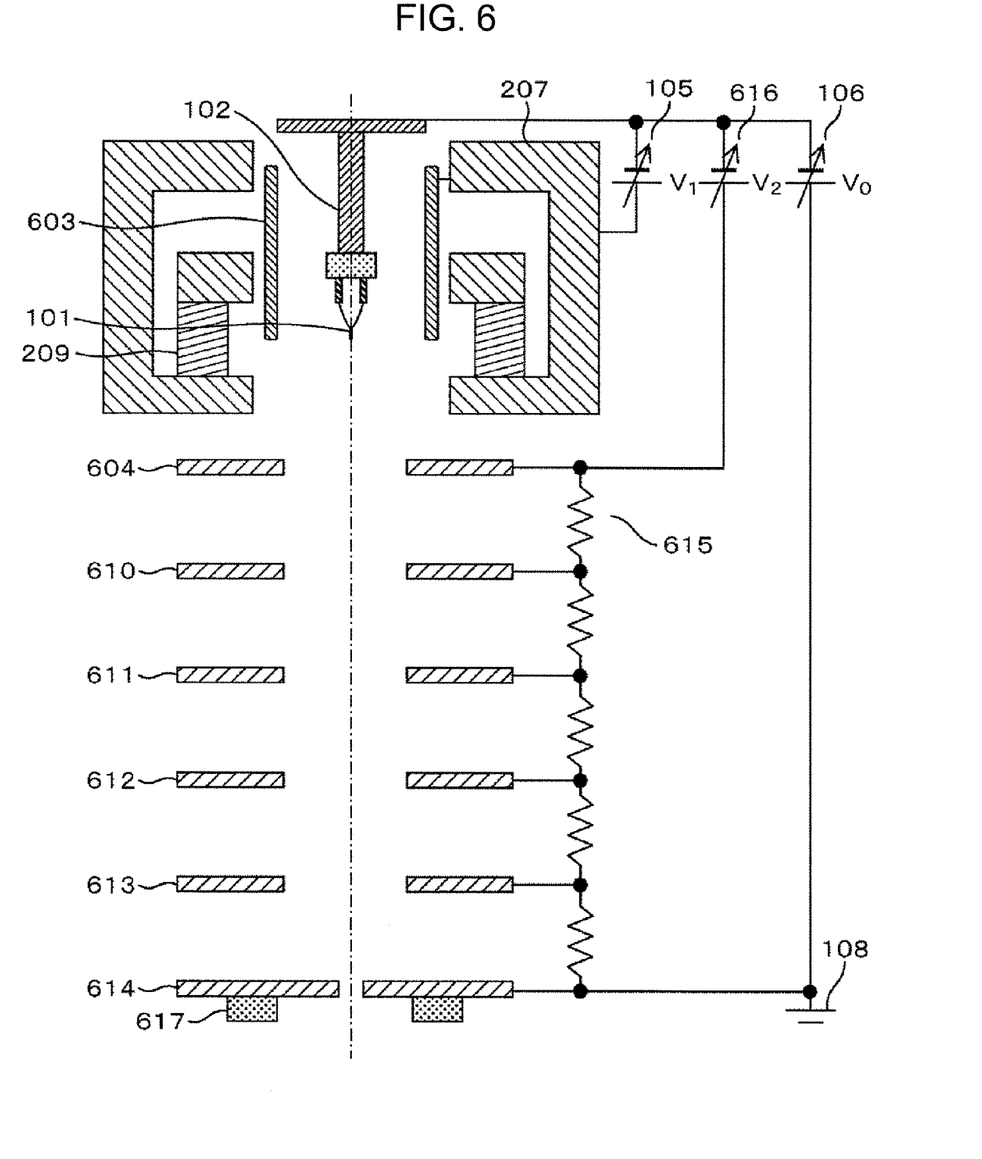
FIG. 6 illustrates a structure of an immersion-type electron gun which includes an accelerator tube and has an acceleration voltage of 100 kV to 300 kV according to an embodiment of the present invention.

The structures according to Embodiments 1 to 3 can be easily applied to a higher-pressure electron gun including an accelerator tube. FIG. 6 illustrates a structure of an immersion-type electron gun which includes an accelerator tube and has an acceleration voltage of 100 kV to 300 kV. Similarly in this structure, $V_0$ is applied to the electron source 601, and the potential $V_1$ with respect to the electron source 101 is applied to an extraction electrode 603, so that an electron beam is extracted from the electron source. This electron beam is initially accelerated by the potential difference from a second anode 604 having a potential $V_2$ with respect to the electron source, and is further accelerated through the inside of the accelerator tube (not illustrated) including intermediate electrodes 610 to 613 to reach an anode 614 having a ground potential. In the structure of FIG. 6, the diameter of an electron beam path of each of the second anode 604 and the intermediate electrodes 610 to 613 is set to be at least as large as that of the extraction electrode 303 in FIG. 3, whereby the lens effect of the accelerating electric field is suppressed to be low.

Embodiment 5

Next, in the conventional cold cathode field-emission electron gun having the structure in FIG. 1, a large part of the electron beam emitted from the electron source 101 is blocked by the extraction electrode aperture 109, and only part thereof passes through the aperture to be accelerated toward the anode 107. In contrast, in the structure of the electron gun in FIG. 2 according to the present invention, the extraction electrode 203 does not have an aperture structure, and hence the anode 204 is irradiated directly with the electron beam.

In the cold cathode field-emission electron gun in FIG. 2, a heater 210 is provided near the anode 204, and components of the anode 204 are heated in a vacuum before the operation start of the electron gun, whereby emitted gas can be suppressed. Similarly, in the cold cathode field-emission electron gun including the accelerator tube in FIG. 6, a heater 617 is provided near the anode 614, whereby emitted gas can be suppressed.

Embodiment 6

In the above-mentioned embodiments, the permanent magnet is used as the magnetic field lens for converging an electron beam. In the above-mentioned embodiments, the permanent magnet is disposed in the vacuum container, and the vacuum container is disposed in an electron gun chamber. Such a structure can provide effects of the present invention even with the use of a magnet other than the samarium-cobalt magnet which has been subjected to titanium nitride coating, without reducing the degree of vacuum inside of the electron gun chamber.

Note that, not limited to the above-mentioned method, experimental results reveal that, if a permanent magnet which has been subjected to titanium nitride coating (for example, the samarium-cobalt magnet) is used, the magnet can be brought directly into the electron gun chamber without reducing the degree of vacuum inside of the electron gun chamber. In addition, the permanent magnet may be disposed outside of the electron gun chamber. Such a structure can similarly provide effects of the present invention without reducing the degree of vacuum inside of the electron gun chamber.

The above description is given assuming that the permanent magnet is used, but even if a magnetic field is generated using an electromagnetic coil, effects of the present invention can be obtained.

These embodiments can provide an electron gun with smaller aberration than that of the conventional cold cathode field-emission electron gun. As a result, with regard to even an electron beam emitted at a wide angle from an electron source (even a large current), the electron beam can be collected and utilized without relative blurring.

In any use conditions of an electron microscope, in the case where the effective brightness equivalent to that of a standard cold cathode field-emission electron gun is to be obtained, the present invention can secure the amount of taken-out current while suppressing the total amount of emitted current to be as low as about one-tenth of that of the conventional cold cathode field-emission electron gun. As a result, it is possible to obtain a high-performance electron gun having high stability of the amount of emitted current and small energy distribution ΔE of emitted electrons.

In addition, an electron beam having a small spot diameter and high brightness can be supplied even to an electron microscope utilizing a relative large current of 1 nA or larger, for example, an electron microscope having an elemental analysis function.

The present invention can be used as an electron source for a scanning electron microscope, a transmission electron microscope, a scanning transmission electron microscope, and other electron beam apparatuses using an electron beam.

REFERENCE SIGNS LIST 101 electron source
102 electron source holding part
103, 104 Butler-type electrode
105 extraction power supply
106 acceleration power supply
107, 204, 614 anode
108 ground part
109 extraction electrode aperture
110, 203, 303, 403, 503, 603 extraction electrode
207 magnetic path
209 permanent magnet
210, 617, 710 heater
310 inner diameter of smallest part of extraction electrode aperture
410 magnetic path lower surface
604 second anode
610, 611, 612, 613 intermediate electrode
615 bleeder resistor
616 $V_2$ power supply
703 extraction electrode (which also functions as a shield)
711 scattered electron

The invention claimed is:

1. A field-emission electron gun which extracts an electron beam from a cathode and converges the extracted electron beam, the field-emission electron gun comprising:
a magnetic field lens which is provided such that the cathode is disposed inside of a magnetic field of the lens; and
an extraction electrode for extracting electrons from the cathode, the extraction electrode being formed into a cylindrical shape with a constant aperture diameter having a protruding part at the end, wherein the protruding part does not produce lens action of an electric field.

2. The field-emission electron gun according to claim 1, wherein the inner diameter of the protruding part is equal to or larger than 2 mm.

3. The field-emission electron gun according to claim 1, wherein the magnetic field lens is formed of a permanent magnet.

4. The field-emission electron gun according to claim 2, wherein the magnetic field lens is formed of a permanent magnet.

5. The field-emission electron gun according to claim 3, further comprising a moving mechanism which moves a position of the cathode.

6. The field-emission electron gun according to claim 4, further comprising a moving mechanism which moves a position of the cathode.

7. The field-emission electron gun according to claim 1, further comprising a heating section which heats the anode for accelerating the electron beam.

8. The field-emission electron gun according to claim 2, further comprising a heating section which heats the anode for accelerating the electron beam.

9. The field-emission electron gun according to claim 2, wherein a lower end of the extraction electrode has a surface opposed to the anode.

10. The field-emission electron gun according to claim 1, further comprising a heating section which heats the extraction electrode.

11. The field-emission electron gun according to claim 2, further comprising a heating section which heats the extraction electrode.

12. The field-emission electron gun according to claim 10, further comprising, in order to prevent a permanent magnet from being thermally demagnetized by heating of the heater, a structure which thermally isolates the heater and the extraction electrode from a magnetic path of the permanent magnet and the permanent magnet.

13. The field-emission electron gun according to claim 11, further comprising, in order to prevent a permanent magnet from being thermally demagnetized by heating of the heater, a structure which thermally isolates the heater and the extraction electrode from a magnetic path of the permanent magnet and the permanent magnet.

14. An electron beam apparatus which processes and inspects a sample using an electron beam, the electron beam apparatus comprising the field-emission electron gun according to claim 1.

15. An electron beam apparatus which processes and inspects a sample using an electron beam, the electron beam apparatus comprising the field-emission electron gun according to claim 2.

16. The field-emission electron gun according to claim 1, wherein the projecting part is adjacent to the aperture.

* * * * *